Figure 1:
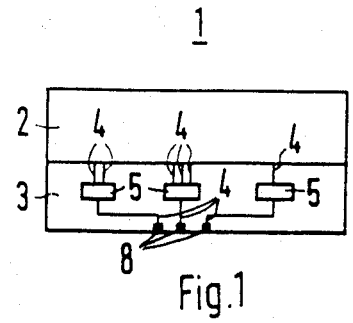

United States Patent [19]

Schlipf et al.

[11] Patent Number: 4,824,693
[45] Date of Patent: Apr. 25, 1989

[54] METHOD FOR DEPOSITING A SOLDERABLE METAL LAYER BY AN ELECTROLESS METHOD

[75] Inventors: Michael Schlipf, Schorndorf; Rolf Zondler, Straubing-Ittling, both of Fed. Rep. of Germany

[73] Assignee: Nokia Graetz GmbH, Pforzheim, Fed. Rep. of Germany

[21] Appl. No.: 157,933

[22] Filed: Feb. 19, 1988

[30] Foreign Application Priority Data

Feb. 19, 1987 [DE] Fed. Rep. of Germany ....... 3705251

[51] Int. Cl.⁴ .............................................. B05D 5/12
[52] U.S. Cl. ...................................... 427/98; 427/58; 427/443.1; 427/304; 427/305
[58] Field of Search ................ 427/98, 443.1, 58, 304, 427/305

[56] References Cited

U.S. PATENT DOCUMENTS

| | | | |
|---|---|---|---|
| 3,041,198 | 6/1962 | Certa | 427/305 |
| 4,321,283 | 3/1982 | Patel | 427/443.1 |
| 4,478,690 | 10/1984 | Scholtens | 427/98 |
| 4,666,078 | 5/1987 | Ohno | 427/98 |
| 4,726,965 | 2/1988 | Zondler | 427/98 |

FOREIGN PATENT DOCUMENTS 1042816  9/1966  United Kingdom .................. 427/98

Primary Examiner—Shrive Beck
Assistant Examiner—Vi Duong Dang
Attorney, Agent, or Firm—Peter C. Van Der Sluys

[57] ABSTRACT

To deposit a solderable metal layer on conductive paths (4) of ITO on substrates of display devices (1) by an electroless method, the conductive paths are activated, prior to the deposition, and the areas not covered by the conductive paths are subsequently inactivated. The activated paths are then metallized with a solderable metal layer so that integrated circuits can be soldered to the metallized conductive paths.

6 Claims, 1 Drawing Sheet

METHOD FOR DEPOSITING A SOLDERABLE METAL LAYER BY AN ELECTROLESS METHOD

The present invention pertains to a method of depositing a solderable metal layer by an electroless method on transparent conductive paths of indium tin oxide on substrates as set forth in the preamble of claim 1.

German Patent No. 28 07 350 discloses a liquid-crystal display device which has a glass substrate as a support for the display device and for an integrated circuit (IC chip). The substrate supports transparent conductive paths of indium oxide. The solderable metal layer of these conductive paths in the invisible part of the display device is effected by depositing two chromium-containing intermediate layers prior to the application of a gold layer. Five layers of chromium, copper, gold, copper and lead tin, respectively, are provided on the IC chip as a bonding layer. The metallization of the conductive paths, i.e., the deposition of the layers, is effected by an evaporation or sputtering process. These methods involve a great amount of energy and are technically complex.

DE-AS No. 23 02 194 describes the manufacture of thin-film circuits by a photoetching technique in which a thin intermediate or adhesion-improving layer and an upper noble-metal layer are deposited on a substrate. The layers can be deposited by evaporation, sputtering or chemical deposition.

DE-AS No. 25 09 912 discloses an electronic thin-film circuit with a substrate plate made of insulating material. The method of making the thin-film circuit includes the steps of depositing a nickel layer on a copper layer and a gold layer on the nickel layer by electroless techniques.

It is the object of the invention to provide a simpler method of depositing a solderable metal layer by an electroless method on transparent conductive paths of indium tin oxide on substrates of the kind mentioned above.

This object is achieved by activating the surface of the conductive paths by immersing the substrate in a bath of palladium chloride and tin chloride, then deactivating the areas not covered by the conductive paths by immersing the substrate in hydrofluoric acid, and by finally depositing the metal layer by an electroless method. Further advantageous features of the invention are set forth in subclaims 2 to 6.

Figure 2:
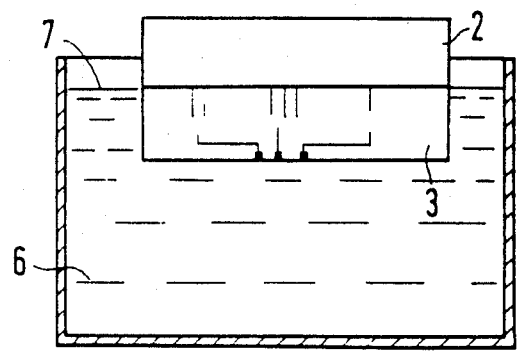

The invention will now be described with the help of the accompanying drawings, in which:

FIG. 1 is a top plan view of a display device, and
FIG. 2 shows the partial immersion of the display device in a bath.

The display device 1 shown in FIG. 1 has a display portion 2 and a portion 3 which will be invisible in the later built-up condition of the display device. The display portion has, e.g., a liquid-crystal display (not shown) which is supported on a substrate such as glass. This is also the material of the portion 3, where it supports conductive paths 4 leading to components 5, such as integrated circuits, and to connections 8 of the display device 1. The connections of the components 5 are connected to the conductive paths 4 by solder or by a conductive adhesive. It is important for this connection of the components 5 with the conductive paths 4 that the conductive paths have a suitable metal layer.

The electrodes present in the display portion 2 of the display device 1 have a transparent, conductive layer of indium tin oxide. The conductive paths 4 in the portion 3 are made of the same material, since the electrodes in the display portion 2 and the conductive paths 4 in the portion 3 can then be produced simultaneously. However, since conductive paths of indium tin oxide do not have a solderable surface, they must be metallized.

The display portion 2 of the display device 1 is manufactured and checked. In this condition, the manufactured and tested display devices do not yet have components 5 attached in the portion 3. In order for the conductive paths 4 to be metallized, the display device is mounted in a working station in which the non-metallic surfaces of the conductive paths 4 are activated, so that a chemical metallization bath can be used. Activation is effected by immersing the portion 3 in a bath which contains, for example, $PdCl_2/SnCl_2$. Such a bath is commercially available from Schlötter under the trade name of "Dynaplate Aktivator".

FIG. 2 schematically shows the immersion of the display device 1 in a bath 6. The display device is immersed only until the bath surface 7 coincides with the separating line between the display portion 2 and the portion 3.

Subsequently, it will be necessary to remove excess palladium compounds and tin compounds in a conditioning step. To this end, the entire display device, or the portion 3, is immersed in a conditioning bath, which is commercially available, for example, from Schlötter under the trade name of "Dynaplate Conditioner".

During activation of the conductive paths 4, the glass surface of the substrate in the portion 3 is also activated to a minor extent. To deactivate the glass surface in the portion 3 again, it is immersed in a bath which contains fluoride ions. In the process, the surface layer on the glass is etched away. Preferably, a 0.1 to 5 weight percent solution of hydrofluoric acid in water is used since this does not corrode the conductive paths 4. A 0.8 to 1.2 weight percent solution of hydrofluoric acid in water is particularly suitable.

Following this pretreatment, the metallization step is performed with the help of a chemical metallization bath, for example the bath which is commercially available from Schering under the trade name of "Novotect", by which, for example, a nickel layer is deposited on the conductive paths 4. The display device 1 is immersed in the metallization bath in a similar working station as the one shown in FIG. 2. The nickel layer thus deposited has a thickness of about 0.2 to 1 μm.

The following is a typical bath composition for the deposition of nickel:
30 g/l of $NiCl_2 \times 6\ H_2O$
10 g/l of $NaH_2PO_2$
100 g/l of sodium citrate
50 g/l of $NH_4Cl$
pH: 8–10.

After metallization of the portion 3 as described above, the components 5 are mounted on the portion 3 and their connections are connected to the conductive paths 4 by solder or adhesive, so as to give a display device which forms a unit together with the components.

We claim:
1. Method of depositing a solderable metal layer by an electroless method on transparent conductive paths of indium tin oxide disposed over that portion of a substrate which is invisible in finished display devices, characterized in that the surface of the conductive paths (4) is activated by immersing the substrate in a bath of palladium chloride and tin chloride, that the areas not covered by the conductive paths (4) are then deactivated by immersing the substrate in a bath containing fluoride ions, and that the metal layer is finally formed by electroless deposition.

2. A method as claimed in claim 1, characterized in that during the activation of the conductive paths tin compounds are formed and after the activation of the conductive paths, said tin compounds which have not been reduced are removed.

3. A method as claimed in claim 2, characterized in that the tin compounds are removed by immersing the substrate in a conditioning bath.

4. A method as claimed in claim 1, characterized in that the bath containing fluoride ions used for the deactivation contains hydrofluoric acid.

5. A method as claimed in claim 4, characterized in that a 0.1 to 5 weight percent solution of hydrofluoric acid in water is used.

6. A method as claimed in claim 5, characterized in that a 0.8 to 1.2 weight percent solution of hydrofluoric acid in water is used.

* * * * *